(12) United States Patent
Coronel et al.

(10) Patent No.: US 6,297,089 B1
(45) Date of Patent: Oct. 2, 2001

(54) METHOD OF FORMING BURIED STRAPS IN DRAMS

(75) Inventors: Philippe Coronel, Massy; Edith Lattard, Trets; Renzo Maccagnan, Villabe, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/447,630

(22) Filed: Nov. 23, 1999

(30) Foreign Application Priority Data

Nov. 26, 1998 (EP) .................................................. 98480081

(51) Int. Cl.[7] .............................................. H01L 21/8242
(52) U.S. Cl. ........................ 438/246; 438/244; 438/247; 438/423
(58) Field of Search .................................... 438/246, 244, 438/243, 239, 250, 386, 387, 393, 396, 259, 423, 424, 247

(56) References Cited

U.S. PATENT DOCUMENTS 6,063,657 * 5/2000 Bronner et al. ...................... 438/244

OTHER PUBLICATIONS

Radens et al., "A 0.135 um 6F Trench Sidewall Vertical Device Cell For 4 Gb/16 Gb DRAM", IEEE, Symp.RLSI Tech 1988,pp. 80 &81.*

* cited by examiner

Primary Examiner—Charles Bowers
Assistant Examiner—Yennhu B. Huynh
(74) Attorney, Agent, or Firm—Eric W. Petraske

(57) ABSTRACT

A conventional initial deep trench structure consists of a patterned $Si_3N_4$ pad layer coated silicon substrate with deep trenches formed therein. The trenches are partially filled with doped polysilicon (POLY1). A dielectric film is interposed between said polysilicon fill and the substrate to create the storage capacitor. A TEOS $SiO_2$ collar layer conformally coats the upper portion of the structure. Now, the TEOS $SiO_2$ is dry etched in a two-step process performed in the same RIE reactor. In the first step, the TEOS $SiO_2$ is etched at least 6 times faster than the $Si_3N_4$ (stopping on the $Si_3N_4$ pad layer). In the second step, the operating conditions ensure a partially isotropic dry etch, preferably with twice the power and 1.25 times the pressure, thus providing a vertical etch rate 6× the horizontal rate. As a result of this step, the upper part of the silicon substrate in the trench is exposed without damages. Next, N-type dopant is implanted in the upper portion of the silicon substrate to create a doped region. The trench is filled with a layer of doped polysilicon (POLY2) which is planarized by chemical-mechanical polishing down to approximately the $Si_3N_4$ pad layer surface and finally recessed down to a depth level substantially coplanar with the silicon surface substrate to create a POLY2 stud. The buried strap is formed by the doped region and POLY2 stud. The above method presents significant advantages in terms of product reliability, throughput improvements and process flow simplification.

6 Claims, 7 Drawing Sheets

METHOD OF FORMING BURIED STRAPS IN DRAMS

FIELD OF THE INVENTION

The present invention relates to the manufacture of semiconductor integrated circuits and more particularly to an improved method of forming the buried strap that connects the source of the array transfer transistor to an electrode of the storage capacitor in each memory cell of DRAM chips.

BACKGROUND OF THE INVENTION

In the manufacture of semiconductor integrated circuits and particularly in Dynamic Random Access Memory (DRAM) chips, connecting straps are extensively used. As is known to those skilled in the art, in DRAM chips, an array transfer transistor, typically an Insulated Gate Field Effect Transistor (IGFET) and a storage capacitor are associated to form the elementary memory cell. The strap connects the source region of the IGFET transistor and an electrode of the storage capacitor to allow an electrical contact therebetween. In the last generation of DRAM chips, due to scaling reduction effects, the storage capacitor is formed in a trench etched in the silicon substrate. In this case, the strap which consists in the combination of a doped region formed by ion implantation in the silicon substrate and a doped polysilicon stud is usually referred to in the technical literature as the "buried strap".

The buried strap is fabricated early in the wafer fabrication process flow. It must ensure an excellent electrical connection at only a small processing cost while requiring little silicon area. However, it must not degrade the retention time of the memory cell.

A conventional buried strap (BS) formation process is described hereinbelow in conjunction with FIG. 1 and FIGS. 2A to 2F. All the processing steps are conducted in the so-called Deep Trench Module.

FIG. 1 schematically illustrates the starting structure referenced 10 which basically consists of a P-type doped silicon substrate 11 with a 10 nm thick silicon oxide ($SiO_2$) and a 170 nm thick silicon nitride ($Si_3N_4$) layer, respectively referenced 12 and 13 formed thereon. These two layers will be referred to hereafter as the $Si_3N_4$ pad layer 13 for brevity. Silicon substrate 11 includes an N type doped layer and a P type doped layer labeled N-band and P-well respectively as standard. Deep trenches 14 have been conventionally etched in the silicon substrate 11. A dual nitride-oxide (NO) dielectric film 15 coats the bottom surface of the trench 14. As is apparent in FIG. 1, a doped polysilicon fill (POLY1) referenced 16 has been recessed to a depth of about 1.2 $\mu$m. An 8 nm thick thermal silicon oxide layer 17 passivates the vertical walls of the trench above the POLY1 material and the bottom of the trench above the polysilicon fill 16. The N-band and the N type heavily doped "buried plate" (shown in dotted line in FIG. 1) on the one hand and the doped polysilicon fill 16 (POLY1) on the other hand form the two electrodes of the storage capacitor that are isolated one from another by the dielectric film 15. Typically, the trench 14 has a depth of about 7 $\mu$m and an oblong section of about 500*350 nm at the substrate 11 surface. Finally, a TEOS $SiO_2$ collar layer 18 having a thickness of about 60 nm is conformally deposited by LPCVD to coat structure 10 top surface. For instance, the TEOS $Sio_2$ material can be deposited in a TEL ALPHA 8S tool using the process parameters recited below.

TABLE 1

| | |
|---|---|
| Pressure | 1 Torr |
| Temperature | 675° C. |
| TEOS flow | 200 cc/min |
| $N_2$ flow | 100 cc/min |
| Duration | 17 min |

The target is to obtain a thickness of about 60 nm atop the structure 10 surface (measured on a monitor wafer) and a thickness of about 30 nm on the sidewall. After TEOS $SiO_2$ deposition, an anneal is performed in a SVG VTR 7000+ tool for TEOS $SiO_2$ material densification. Anneal conditions are:

TABLE 2

| | |
|---|---|
| Duration | 20 min |
| Temperature | 1000° C. |
| $N_2$ flow | 20 l/min |

Now, the TEOS $SiO_2$ collar layer 18 is first anisotropically etched down to the $Si_3N_4$ pad layer 13. This dry etch step is controlled by an optical etch end-point technique (CN line) using an optical emission spectrometer. When the surface of the pad $Si_3N_4$ layer 13 is reached, the etching is stopped. Because of topology differences between the array and kerf/support areas at the wafer surface, the TEOS $SiO_2$ material is etched more in the trenches. It is essential that the collar layer 18 remains at the top of the trench 14 as illustrated in FIG. 2A at about half the $Si_3N_4$ pad layer 13 thickness. On the other hand, no TEOS $SiO_2$ of the collar layer 18 must remain at the bottom of the trench 14, so that the doped polysilicon fill 16 surface is exposed to subsequently ensure an excellent electrical contact between the drain region of the IGFET and the polysilicon fill 16 forming a first electrode of the storage capacitor. Preferably, this step is continued by a cleaning step still performed in the same reactor to ensure polymer residue removal from the reactor walls.

For instance, when the above dry etching step is performed in the MxP+ chamber of an AME 5200 tool, commercially available from Applied Materials, Santa Clara, Calif., USA, operating conditions recited below are adequate.

TABLE 3

| Dry Etch | |
|---|---|
| Pressure | 75 mTorr |
| Power | 500 w |
| Temperature | 20–40° C. |
| Backside cool. | 2 Torr |
| Magnetic field | 40 G |
| $C_4F_8$/Ar flow | 8/125 sccm |
| Duration | 30 s |

A TEOS $SiO_2$ etch rate 6 times faster than $Si_3N_4$ is ensured with this $C_4F_8$/Ar selective chemistry. This step will be referred to hereinbelow as the collar etch-back step.

Then, the native oxide is stripped with a conventional wet process. For instance the wafer is cleaned first using a BHF solution, then a DHF Huang A/B solution to reduce contact resistance. A 330 nm thick composite layer of amorphous/arsenic doped/amorphous polysilicon material is conformally deposited onto the structure 10 by successive depositions using silane/arsine/silane gas in a LPCVD reactor such as a SVG VTR 7000+ which includes two pairs of injectors installed one at the top and the other at the bottom of the reactor. Operating conditions are briefly summarized in Table 4 below.

TABLE 4

| Gas | silane | arsine | silane |
|---|---|---|---|
| Top Flow | 130 sccm | 100 sccm | 130 sccm |
| Bottom Flow | 30 sccm | | 30 sccm |
| Temp. | 550° C. | 550° C. | 550° C. |
| Pressure | 600 mTorr | 120 mTorr | 600 mTorr |
| Duration | 12 min | 10 min | 146 min |

The composite layer referenced 19 in FIG. 2B (also referred to as POLY2) fills the trenches of all the memory cells. As is known to those skilled in the art, arsenic is an N type dopant.

The POLY 2 material of layer 19 is first planarized by chemical-mechanical polishing in a WESTECH 372 M polisher with a conventional slurry. This step is followed by a brush cleaning to reduce contamination. Next, it is partially removed from the trench 14 in a DPS chamber of an AME 5200 tool, for instance in a $SF_6$ atmosphere. As a result, there is produced the recess illustrated in FIG. 2C. This latter step leaves a doped polysilicon (POLY2) stud still referenced 19 in the trench 14. The bottom of the recess is about at 120 nm under the silicon substrate 11 surface. Recess depth is controlled by laser etch end-point monitoring.

Now, the exposed TEOS $SiO_2$ material of collar layer 18 and the thermal $SiO_2$ material of layer 17 are removed from the upper part of the trench 14 to expose a portion of the trench top side wall by means of a conventional wet process which is known to be isotropic. As is apparent in FIG. 2D, this step etches these materials in some extent under the POLY2 stud 19 surface. Typical operating conditions when a DAI-NIPPON SCREEN (DNS) wet bench tool is used are:

TABLE 5

| Step 1: BE | : $NH_4F:HF:H2O$ | 5:1:48 (in volume) | at 22° C. during 145 s |
|---|---|---|---|
| Step 2: Huang A | : $H_2O:H_2O2:NH_4OH$ | 10:1:1 | at 22° C. during 5 min |
| Step 3: Huang B | : $H_2O:HCl:H_2O2$ | 10:1:1 | at 30° C. during 5 min |

This wet etch step will be referred to hereinbelow as the collar recess step.

The first element of the buried strap is now formed by ion implantation of phosphorus atoms in the substrate 11 to create N type heavily doped regions 20. This implantation step is conventionally performed in an EXTRION E500 HP Medium Current tool with the following process parameters:

TABLE 6

| Dose | $2 \times 1.0 \times 10^{13}/cm2$ |
|---|---|
| Tilt | 30° |
| Energy | 10 keV |
| Twist | 0/180° |

At this stage of the process, the resulting structure is shown in FIG. 2D.

The 3 nm thick native oxide layer produced during the implantation step is removed with the same conventional wet process as mentioned above. A 300 nm thick layer 21 of intrinsic polysilicon (POLY3) is then conformally deposited onto structure 10. It is used to fill the trenches and to terminate the second element of the buried strap. It will be subsequently doped by the POLY2 material during a following reoxidation step. At this stage of the conventional BS fabrication process, the structure 10 is shown in FIG. 2E. Then, the POLY3 layer 21 is planarized by chemical-mechanical polishing and this step is followed by a brush cleaning step to reduce contamination as described above. Finally, the POLY3 layer 21 is recessed 50 nm below the silicon surface still in the DPS chamber as described above. The final structure is shown in FIG. 2F. As is apparent in FIG. 2F, the buried strap referenced 22 is comprised of the N type doped region 20 and the remaining polysilicon (POLY3) of layer 21 in trench 14 shown in FIG. 2E.

The above conventional BS formation process based upon the TEOS $SiO_2$ wet etch step described by reference to FIG. 2D suffers from two main concerns that are inherent to that technique: the lack of an accurate etch end-point detection and the presence of undercuts in the $SiO_2$ layer that are detrimental to the whole wafer fabrication process reliability.

As far as the first point is concerned, it is to be noted that the process time is defined empirically in function of TEOS $SiO_2$ etch rate evaluated on a monitor (or blanket) wafer but not on a product wafer and moreover it is very dependent of etch operating conditions (bath, bench, . . . ). As a consequence, it has to be selected to its maximum value to be sure that there are no longer any TEOS $SiO_2$ and thermal oxide residues on the trench side wall upper part as represented by defect 23 in FIG. 3. A maximum duration is also necessary to obviate a variable dip-out (defect referenced 24 in FIG. 3) which in turn would cause fluctuations in the active section of the buried strap 22. These defects are strongly dependent of the TEOS $SiO_2$ collar layer 18 thickness. If too thick, TEOS $SiO_2$ (and thermal oxide as well) residues may remain at the buried strap surface, so that the buried strap would be no longer operative (strap open). If too thin, an undesired leakage current could be induced and voids formed during POLY2 deposition. As a result, a high reliability TEOS $SiO_2$ collar layer thickness control would be required to ensure the buried strap integrity for minimum electrical resistance.

As to the second point, as is known to those skilled in the art, the above described wet etch process is essentially isotropic so that undesired undercuts (referenced 25 in FIG. 3) are formed in the $SiO_2$ layer 12 which will detrimentally affect the subsequent deposition steps by creating voids as is known to those skilled in the art.

SUMMARY OF THE PRESENT INVENTION

It is therefore a primary object of the present invention to provide an improved method of forming the buried strap in DRAM chips.

It is another object of the present invention to provide an improved method of forming the buried strap in DRAM chips wherein the TEOS $SiO_2$ collar layer is totally removed by dry etching in a two-step process.

It is still another object of the present invention to provide an improved method of forming the buried strap in DRAM chips wherein the two steps of dry etching the TEOS $SiO_2$ collar layer are performed in the same RIE (reactive ion etching, also referred to as dry etching) tool so that a fully clusterized process is now possible.

It is still another object of the present invention to provide an improved method of forming the buried strap in DRAM chips wherein the TEOS $SiO_2$ collar layer etching is no longer sensitive to the TEOS $SiO_2$ collar layer thickness variations.

It is still another object of the present invention to provide an improved method of forming the buried strap in DRAM chips which reduces the number of processing steps.

The accomplishments of these and other related objects is achieved by the improved method according to the present invention which comprises the steps of:

providing a structure consisting of a patterned $Si_3N_4$ pad layer coated silicon substrate with deep trenches formed therein; the trenches being partially filled with doped polysilicon (POLY1) with a dielectric film interposed between the POLY1 fill and the substrate to create the storage capacitor of the memory cell;

conformally depositing a TEOS $SiO_2$ collar layer by LPCVD;

dry etching the TEOS SiO2 collar layer to expose the POLY1 fill in the trench and the silicon substrate in the upper portion of the trench at the buried strap location in a two step process performed in the same RIE reactor;

a) in the first step (collar etch-back), the operating conditions ensure a high selectivity to etch the TEOS $SiO_2$ at least 6 times faster than the $Si_3N_4$, this step is stopped when the top of the $Si_3N_4$ pad layer is reached;

b) in the second step (collar etch), the operating conditions are such as the dry etching is partially isotropic to create a non negligible lateral etch component to expose a portion of upper portion of the silicon substrate without damaging it;

implanting an N type dopant in the upper portion of the silicon substrate to create the doped region which is a first element of the buried strap;

filling the trench with a layer of doped polysilicon (POLY2);

planarizing the structure by chemical-mechanical polishing to remove the doped polysilicon (POLY2) down to approximately the $Si_3N_4$ pad layer surface; and etching the doped polysilicon (POLY2) down to a given depth level to create a POLY2 stud the top surface of which is substantially slightly below the silicon surface substrate wherein so that tho doped region and the POLY2 stud form the buried strap.

The above method exhibits significant advantages in terms of product reliability, throughput improvements and process flow simplification.

The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

DESCRIPTION OF A PREFERRED EMBODIMENT

Figure 1:
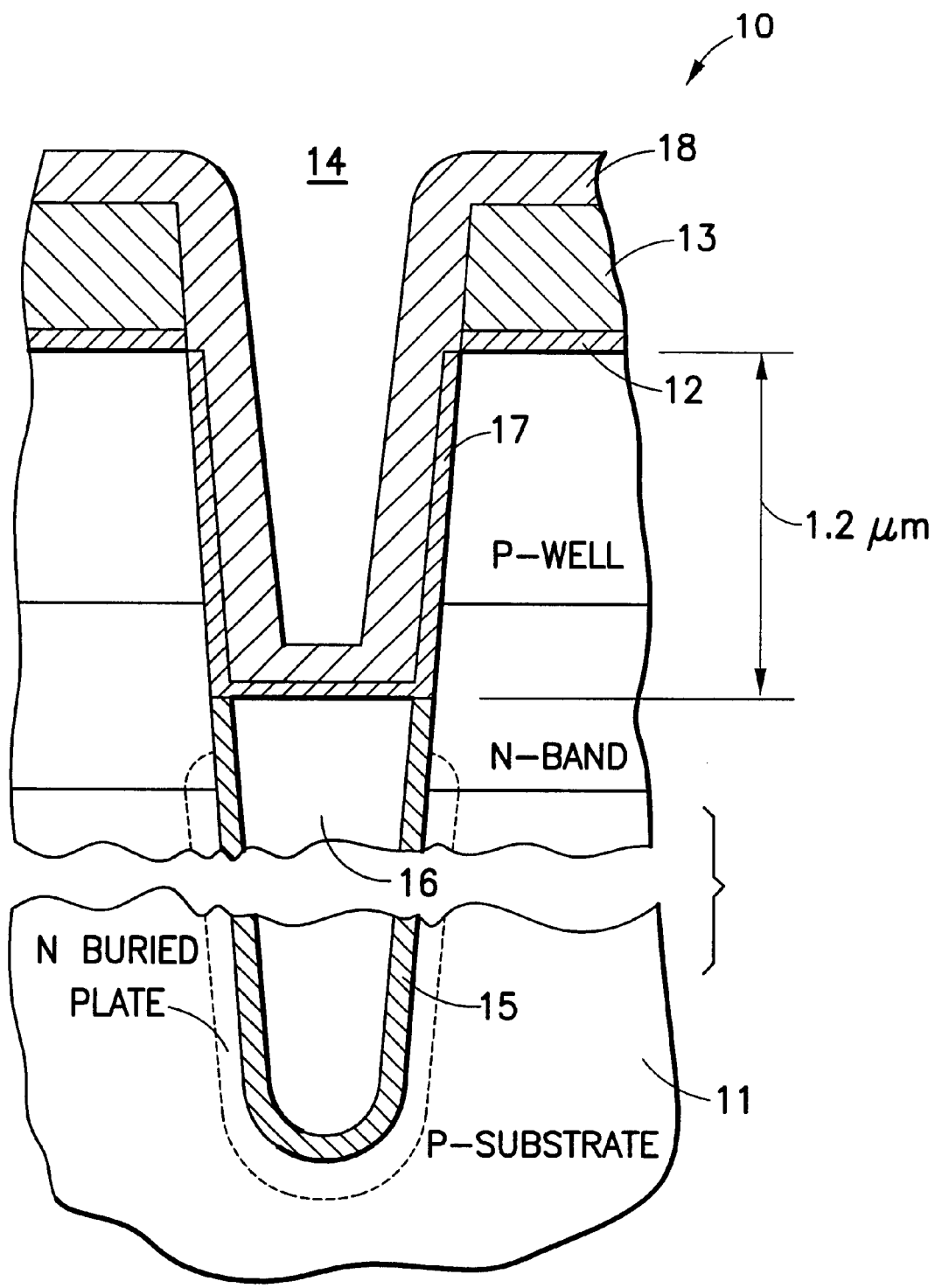
FIG. 1 shows the starting structure at the initial step of the buried strap fabrication process.
Figure 4A:
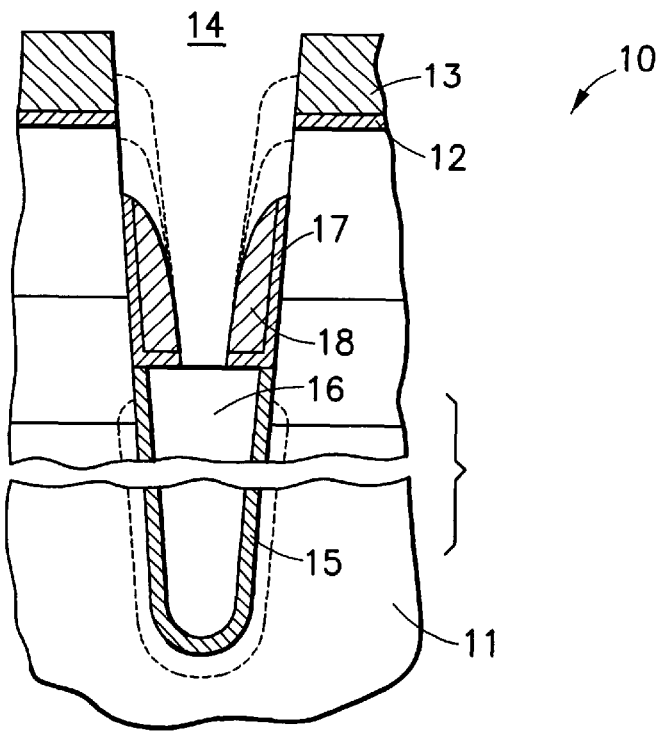
FIGS. 4A to 4C show the structure of FIG. 1 undergoing the essential steps of the buried strap fabrication process according to the present invention.

The essential steps of the improved buried strap (BS) formation process will be briefly described by reference to FIGS. 4A to 4C. The initial structure is still the structure depicted in FIG. 1.

Figure 2A:
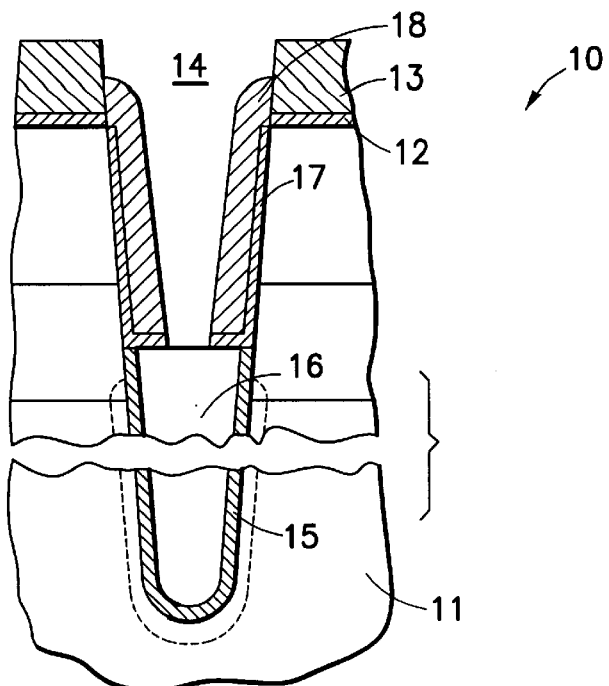
FIGS. 2A to 2F show the structure of FIG. 1 undergoing the essential steps of a prior art buried strap fabrication process.
Figure 2B:
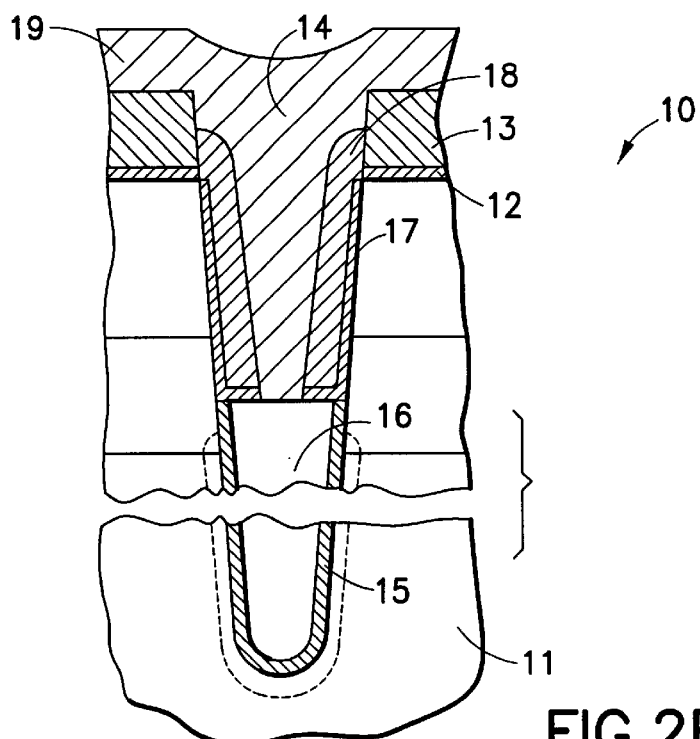
Figure 2C:
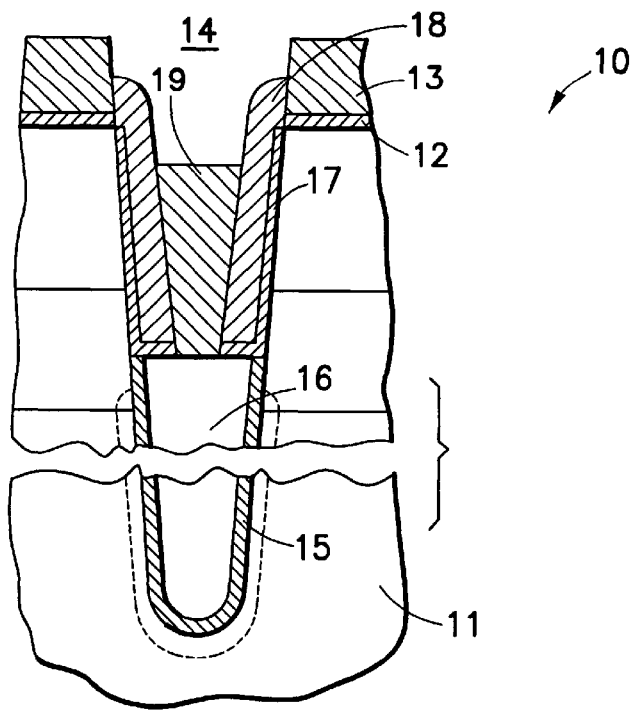
Figure 2D:
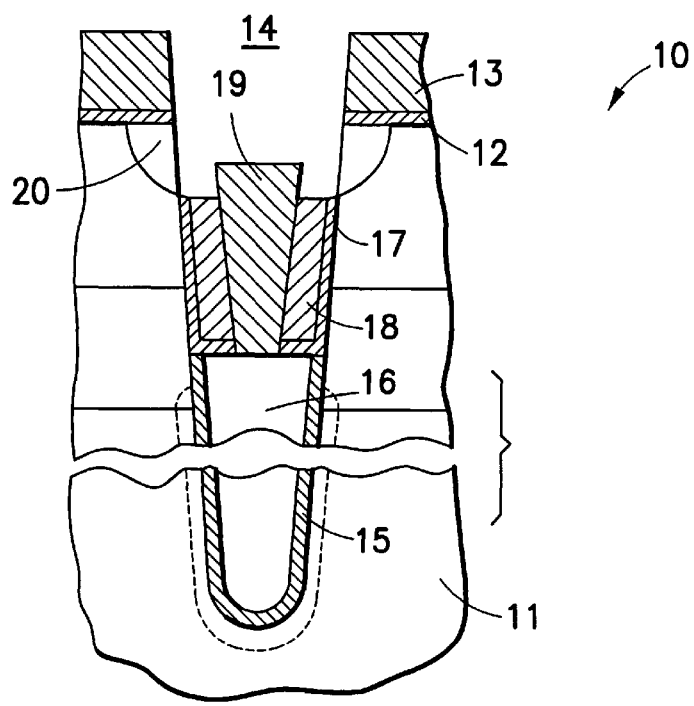
Figure 2E:
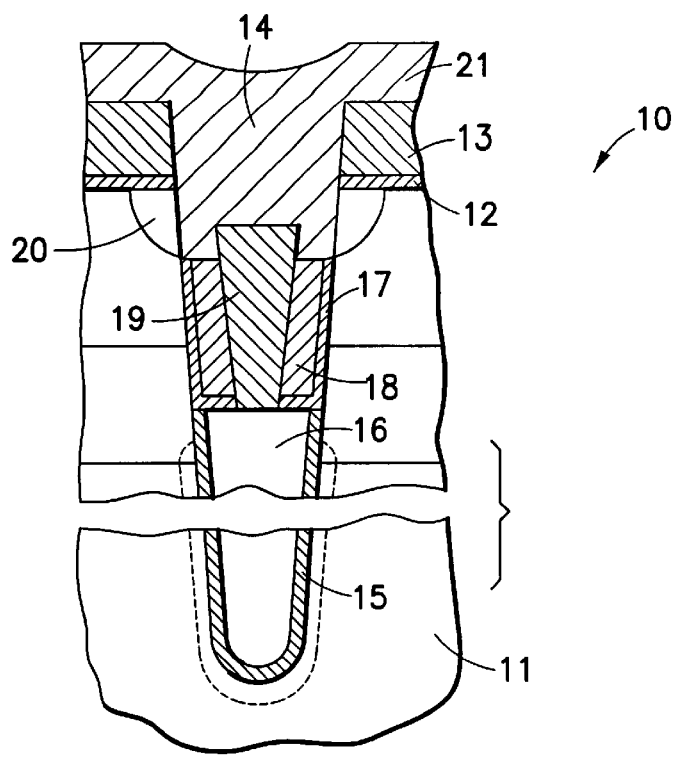
Figure 2F:
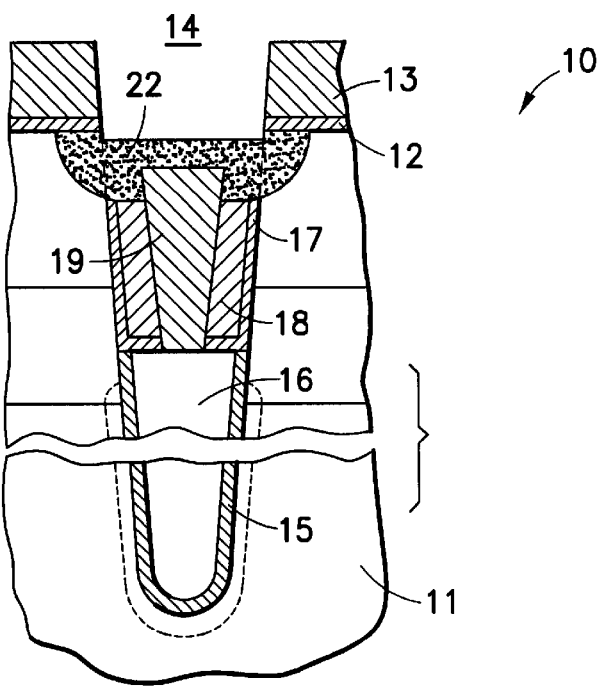

The etching of the TEOS $SiO_2$ material of collar layer 18 is now performed by a two-step dry etch process in a RIE reactor. The first step (collar etch-back) is used to etch the TEOS $SiO_2$ on the top of the structure 10 and is stopped when the $Si_3N_4$ pad layer 13 is reached in the same manner as described above. At the end of step 1, the structure 10 has thus the aspect shown in FIG. 2A. During the second step (collar recess), the TEOS $SiO_2$ is etched on the side wall of the trench 14 to expose the trench upper portion with no erosion of the silicon substrate 11. In the conventional process described above by reference to FIGS. 2A to 2F, this second step was done in a wet bench. Preferably, these two steps are continued by a third one still performed in the same RIE reactor to ensure polymer residue removal from the reactor walls. Therefore, according to the present invention, all these three steps are performed in the same RIE reactor, allowing thereby a fully clusterized process. The step 2 operating conditions are detailed below (operating conditions for steps 1 and 3 are quite similar to those described above in Table 3 in connection with the conventional BS formation process) assuming the etching is performed in the same M×P+ chamber of the AME 5200 tool as step 1.

TABLE 7

| | |
|---|---|
| Pressure | 100 mTorr |
| Power | 1080 W |
| Temperature | 20–40° C. |
| Backside cool. | 2 Torr |
| Mag. field | 10 G |
| $C_4F_8$/Ar flow | 8/125 sccm |
| Duration | 35 s |

The duration of this step is determined through experiments conducted with different TEOS $SiO_2$ collar layer thicknesses to reach the desired recess depth. At this stage of the improved BS fabrication process, the structure is shown in FIG. 4A.

It was quite difficult to find adequate step 2 operating conditions for its insertion between steps 1 and 3 to result in a totally clusterized process while producing the desired results summarized below:

1. They must confine the chemistry action to the upper portion of the silicon substrate in the trench without any detrimental effect onto the POLY1 exposed surface. Moreover, this action must not be aggressive to avoid damages to the silicon exposed at the upper portion or any erosion.

2. They must produce a very selective etching between TEOS $SiO_2$ and polysilicon and a low $Si_3N_4$ etch rate.

3. They must permit a progressive etch of the TEOS $SiO_2$ (and thermal oxide) material only in the upper portion of the silicon substrate but not in the remaining portion of the trench to maintain the integrity of the TEOS $SiO_2$ layer thickness.

These objectives can only be met by a partially isotropic dry etch process. Dry etching is known to be totally anisotropic in essence, but in the present invention the operating conditions have been adjusted to introduce some isotropic capabilities to produce a non negligible lateral etching component. From experiments, the ratio between the vertical etch rate V1 and the lateral etch rate V2 is approximately in the 5–15 range (typically V1/V2=7). As a consequence, the operating conditions of step 2 have necessitated substantial development work to arrive to the structure shown in FIG. 4A. The pressure increment (from 75 to 100 mTorr) and the power increment (from 500 to 1080) have had a significant impact on the $C_4F_8$ partial pressure augmentation which was unexpectedly found a determining factor in obtaining the desired soft profile of the remaining TEOS $SiO_2$ layer in the trench as shown in FIG. 4A. This explain why the etch process of step 2 was originally developed with a wet etch instead. As is apparent in FIG. 4A, the POLY1 fill is exposed without dip-out effects due to the progressiveness of the etch process while the TEOS $SiO_2$ material coating the side wall of the trench have been successfully removed without degrading the surface of the exposed silicon substrate. With the etch parameters of step 2 described above, there is an absolute certainty that no TEOS $SiO_2$ material remains at the bottom of the trench so that at the end of step 2, the POLY1 material is perfectly exposed.

Now the doped region of the silicon substrate to be subsequently used as a part of the buried strap is created by an ion implantation step conducted in the same EXTRION E500 tool with the operating conditions recited below.

TABLE 8

| | |
|---|---|
| Tilt angle | 30° |
| Dose | $2 \times 0.5 \times 10^{13}/cm^2$ |
| Energy | 10 keV |
| Twist | 0/180° |

Figure 4B:
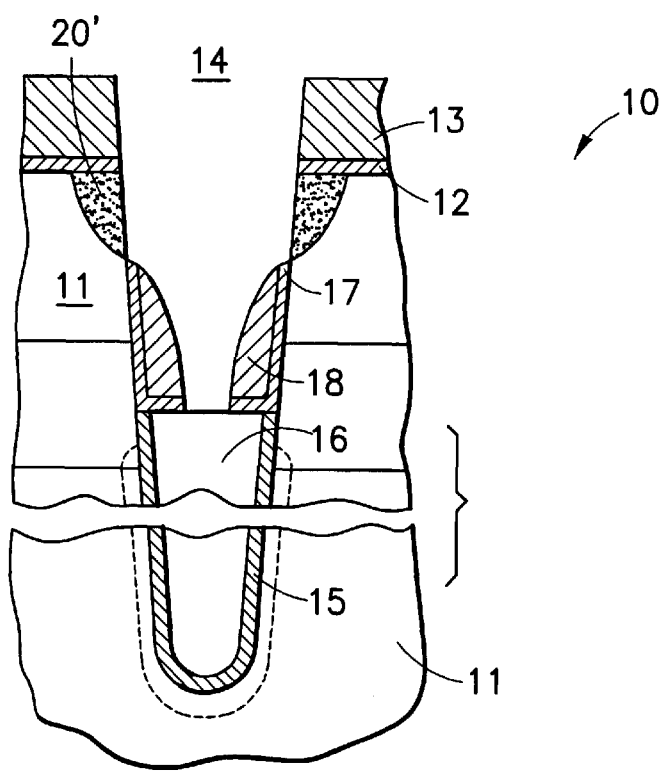
Figure 4C:
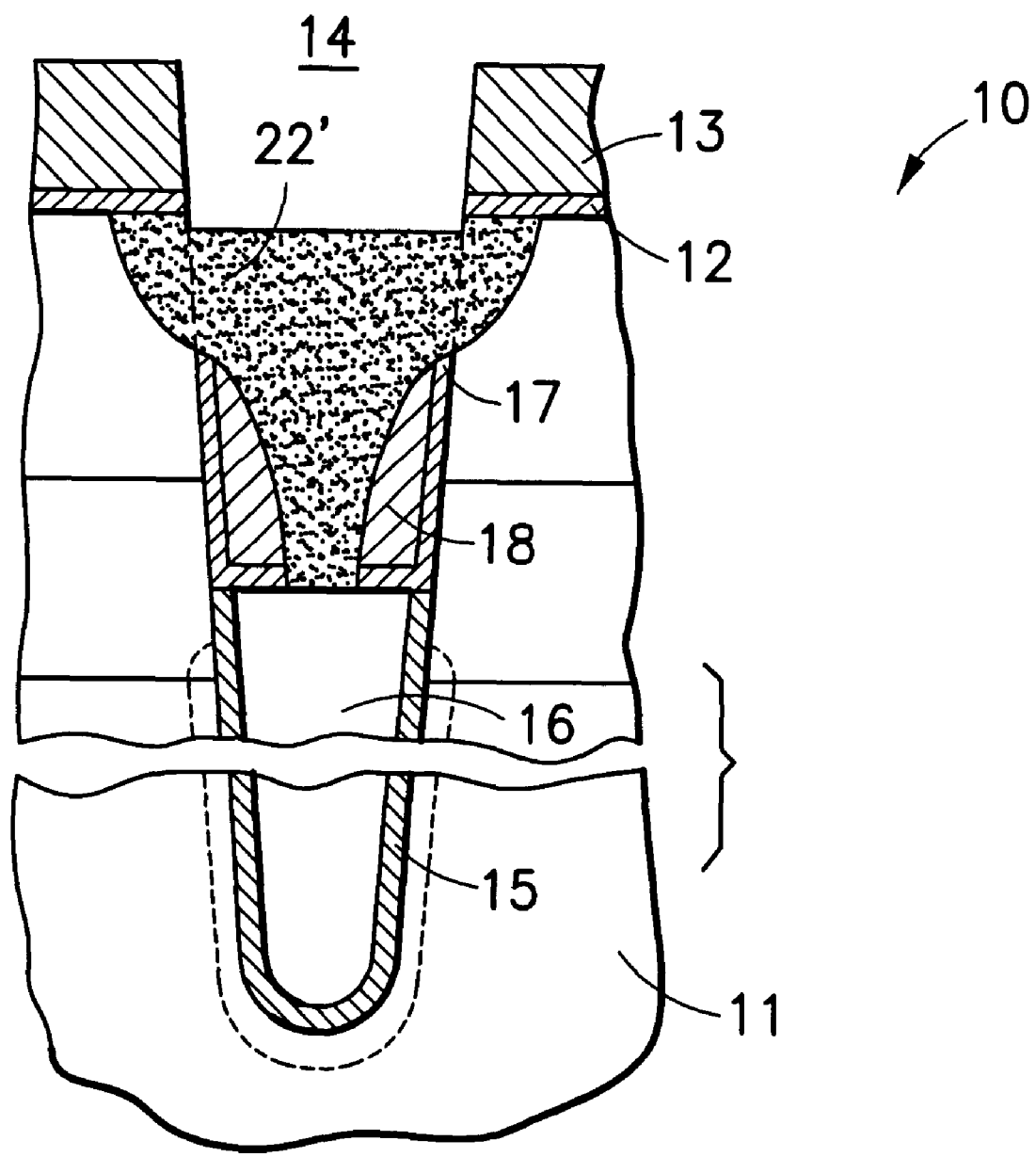

At this stage of the BS fabrication process according to the method of the present invention, the structure 10 is shown in FIG. 4B. The doped region now referenced 20' is the first element of the final buried strap. With regards to the implantation parameters given above, it is to be noticed that the dose has been reduced by a factor of 2.

The process is continued by a cleaning step to pre clean the silicon substrate surface in a CFM 8050 tool using the Huang A/B step described above and a DHF solution ($H_2O$:HF 200:1 at 26° C. during 3 min) before POLY2 deposition.

Then, the trench is filled with doped polysilicon to produce POLY2 layer 19'. This step is performed in the same SVG tool using substantially the same operating conditions except the step 3 duration which is now 138 min.

Next, the POLY2 layer 19' is planarized by chemical-mechanical polishing in the WESTECH tool to produce a smooth surface and this step is followed by a brush clean in a DNS tool as mentioned above. Finally, the POLY2 material is recessed also as described above, so that at the end of this step, the top surface of the remaining POLY2 layer 19' is 50 nm below the silicon substrate surface 11 (as it was in the conventional process). The final structure 10 is shown in FIG. 4C, where the buried strap is now referenced 22'. This terminates the improved buried strap fabrication process.

The improved buried strap fabrication process has a number of advantages when compared with the conventional one. First in terms of process flow simplification. If we remind the conventional BS fabrication process, it is important to remark that after POLY1 deposition, the steps of wet etching the TEOS $SiO_2$ and thermal silicon oxide materials, the steps of depositing, planarizing and recessing the POLY3 material have been suppressed. The elimination of the wet etch step, even it has been replaced by a dry etch step, is of particular importance. In addition, the shift from a fully isotropic wet etch to an essentially anisotropic but partially isotropic dry etch according to the present invention allows to perform all the etch operation by dry etching in the same RIE reactor for a totally clusterized process.

The advantages are listed below:
1. Due to an important overetch performed during the TEOS $SiO_2$ dry etch at step 2, no TEOS and thermal oxide residue is observed at bottom of the trench.
2. No thermal oxide remains on buried strap doped region exposed surface.
3. No undercut is produced in the $SiO_2$ pad layer as dry etch technique is essentially anisotropic.
4. No void formation during POLY2 fill as dip-out phenomena disappears, so that there is no longer any vertical leakage current.
5. Elimination of the POLY2/POLY3 interface.

Figure 3:
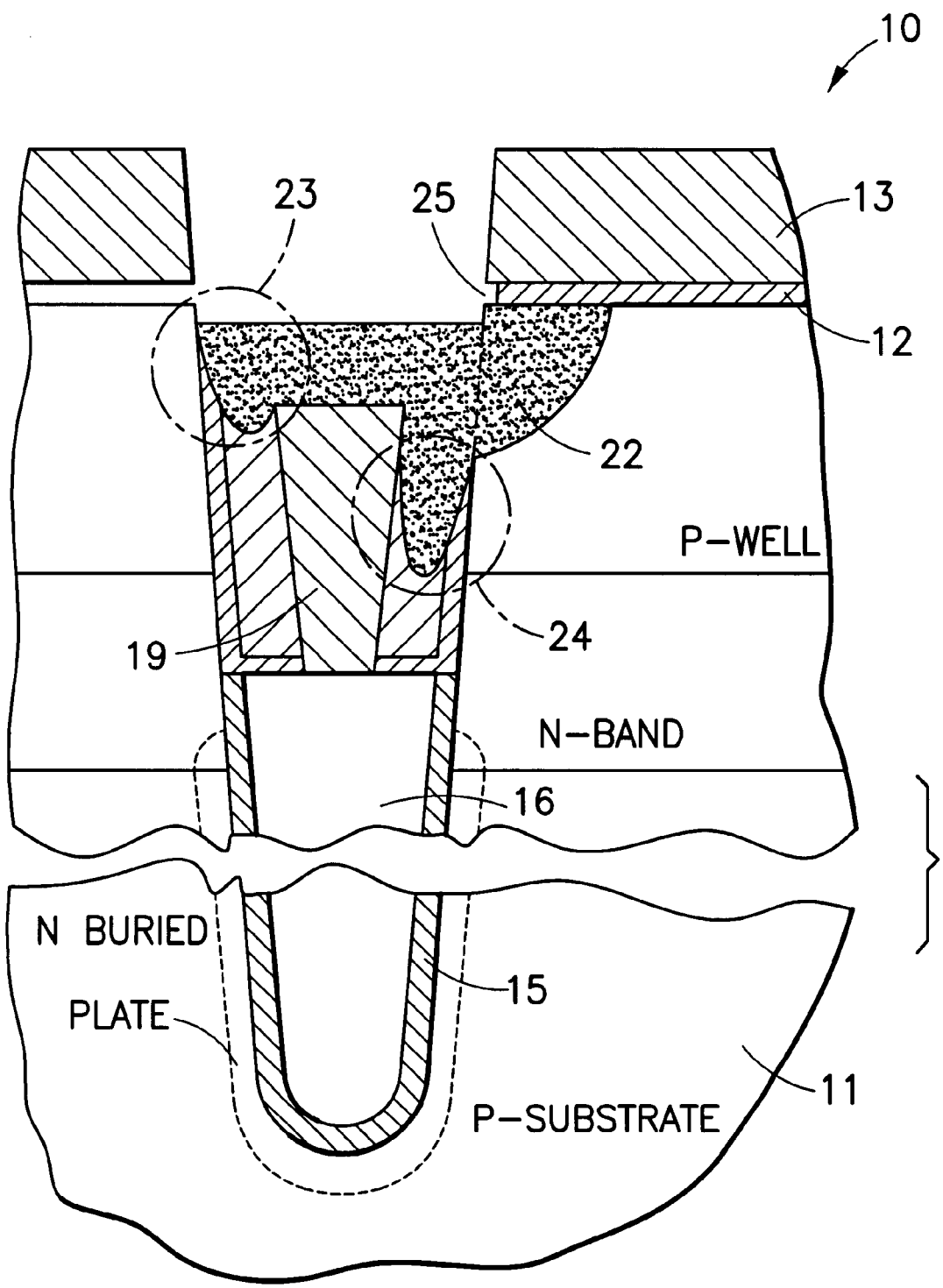
FIG. 3 shows the structure that is obtained at the end of this prior art buried strap fabrication process which points out some inconveniences thereof in terms of defects.

As result, all the concerns and defects described above by reference to FIG. 3 disappear with the method of the present invention.

What is claimed is:

1. A method of forming buried straps in deep trenches of a set of memory cells in a DRAM chip comprising the steps of:

providing a structure consisting of a silicon substrate having a nitride pad layer thereon with a set of deep trenches formed therein, said trenches being partially filled with a first layer of doped polysilicon with a dielectric film interposed between said first layer of doped polysilicon fill and said substrate to create the storage capacitor of said memory cell;

conformally depositing a TEOS $SiO_2$ collar layer above said doped polysilicon and dry etching said TEOS collar layer to expose a top surface of said first layer of doped polysilicon fill and said silicon substrate in a buried strap location at an upper portion of said trench in a two step process;

a) in a first step, etching said TEOS with a high selectivity to TEOS at least 6 times faster than $Si_3N_4$, and stopping said first step on said top surface of said pad layer;

b) in a second step, etching said TEOS partially isotropically to create a non negligible lateral etch component V2 in addition to a vertical etch component V1 and the ratio between said vertical and the lateral etch components V1/V2 is in the range of 5–15 to expose a portion of said upper portion of said substrate on side walls of said trench;

implanting a dopant in said upper portion of said silicon substrate adjacent said trench to create a first element of said buried strap;

filling said trench with a second layer of doped polysilicon, whereby said doped region and a doped polysilicon stud form said buried strap.

2. A method of forming buried straps according to claim 1, wherein said ratio between said vertical and the lateral etch components V1/V2 is about 7.

3. A method of forming buried straps according to claim 2, wherein said etching step 1b) is performed with substantially twice the power of said step 1a) and said etching step 1b) is performed with a pressure substantially 1.25 times the pressure of said step 1a).

4. A method of forming buried straps in deep trenches of a set of memory cells in a DRAM chip comprising the steps of:

providing a structure consisting of a silicon substrate having a nitride pad layer thereon with a set of deep trenches formed therein, said trenches being partially filled with a first layer of doped polysilicon with a dielectric film interposed between said first layer of doped polysilicon fill and said substrate to create the storage capacitor of said memory cell;

conformally depositing a TEOS SiO$_2$ collar layer above said doped polysilicon and dry etching said TEOS collar layer to expose a top surface of said first layer of doped polysilicon fill and said silicon substrate in a buried strap location at an upper portion of said trench in a two step process;
- a) in a first step, etching said TEOS with a high selectivity to TEOS at least 6 times faster than Si$_3$N$_4$, and stopping said first step on said top surface of said pad layer;
- b) in a second step, etching said TEOS partially isotropically to create a non negligible lateral etch component V2 in addition to a vertical etch component V1 and the ratio between said vertical and the lateral etch components V1/V2 is in the range of 5–15, to expose a portion of said upper portion of said substrate on side walls of said trench;

implanting a dopant in said upper portion of said silicon substrate adjacent said trench to create a first element of said buried strap;

filling said trench with a second layer of doped polysilicon, planarizing the structure by chemical-mechanical polishing to remove said second layer of doped polysilicon outside said trench down to approximately a top surface of said pad layer; and, etching said doped polysilicon below the surface of said substrate, thereby forming a polysilicon stud adjacent said first element and together therewith forming said buried strap.

5. A method of forming buried straps according to claim 4, wherein said ratio between said vertical and the lateral etch components V1/V2 is about 7.

6. A method of forming buried straps according to claim 5, wherein said etching step 1b) is performed with substantially twice the power of said step 1a) and said etching step 1b) is performed with a pressure substantially 1.25 times the pressure of said step 1a).

* * * * *